United States Patent
Liu et al.

(10) Patent No.: US 11,984,740 B2
(45) Date of Patent: May 14, 2024

(54) TEMPERATURE PROTECTIVE DEVICE FOR FILTER CAPACITOR BANK

(71) Applicant: SANTAK ELECTRONIC (SHENZHEN) CO., LTD., Shenzhen (CN)

(72) Inventors: Dan Liu, Shenzhen (CN); Dawei Zheng, Shenzhen (CN); Sui Ouyang, Shenzhen (CN); Lingfu Ou, Shenzhen (CN); Dewu Kang, Shenzhen (CN)

(73) Assignee: Santak Electronic (Shenzhen) Co., Ltd., Shenzhen (CN)

( * ) Notice: Subject to any disclaimer, the term of this patent is extended or adjusted under 35 U.S.C. 154(b) by 502 days.

(21) Appl. No.: 17/471,977

(22) Filed: Sep. 10, 2021

(65) Prior Publication Data
US 2022/0085632 A1    Mar. 17, 2022

(30) Foreign Application Priority Data
Sep. 11, 2020   (CN) .......................... 202010951512.1

(51) Int. Cl.
*H02J 7/00*    (2006.01)
*G01R 31/64*    (2020.01)
*H02J 7/34*    (2006.01)

(52) U.S. Cl.
CPC .......... *H02J 7/00309* (2020.01); *G01R 31/64* (2020.01); *H02J 7/345* (2013.01)

(58) Field of Classification Search
CPC ................................................. H02J 7/00309
(Continued)

(56) References Cited

U.S. PATENT DOCUMENTS 5,309,324 A * 5/1994 Herandez ............. H05K 1/0206
                                           361/811
8,970,516 B2 * 3/2015 Black ................... G02B 26/001
                                           345/173
(Continued)

FOREIGN PATENT DOCUMENTS

CN        202076131      12/2011
CN        203406649      1/2014
(Continued)

OTHER PUBLICATIONS

Chinese Search Report dated Mar. 24, 2021 issued for corresponding Chinese patent application No. 202010951521. (3 pages.).

*Primary Examiner* — Jerry D Robbins
(74) *Attorney, Agent, or Firm* — Stanek Lemon Crouse & Meeks, PA

(57) ABSTRACT

The present invention provides a temperature protective device for a filter capacitor bank. The capacitor bank comprises two or more capacitors which are arranged in an array manner. The temperature protective device comprises a temperature measurement device which comprises: a cover body covering the capacitor bank; a single temperature sensor fixed at a center area of the cover body, which is used for measuring a temperature value of the capacitor bank; and a heat conduction pad located between the cover body and the capacitor bank, wherein the heat conduction pad and the cover body have fitted shapes. The temperature protective device of the present invention saves cost and can accurately realize temperature protection of the capacitor bank.

16 Claims, 6 Drawing Sheets

(58) Field of Classification Search
USPC .......................................................... 320/150
See application file for complete search history.

(56) References Cited

U.S. PATENT DOCUMENTS

| | | | |
|---|---|---|---|
| 2005/0134232 A1* | 6/2005 | Yamamoto | H02H 5/042 |
| | | | 320/150 |
| 2011/0273834 A1* | 11/2011 | Moriai | H05K 1/02 |
| | | | 361/679.32 |
| 2012/0130576 A1* | 5/2012 | Sugiyama | B60L 15/00 |
| | | | 903/903 |
| 2012/0148876 A1* | 6/2012 | Zeng | H01M 10/4257 |
| | | | 429/7 |
| 2014/0065448 A1* | 3/2014 | Ahn | H01M 50/105 |
| | | | 429/7 |
| 2015/0214583 A1 | 7/2015 | Lim et al. | |
| 2016/0204481 A1* | 7/2016 | Ryu | H02J 7/007194 |
| | | | 429/7 |
| 2021/0100128 A1* | 4/2021 | Lyu | H05K 1/0204 |
| 2021/0328279 A1* | 10/2021 | Jeong | H01M 50/569 |
| 2023/0389804 A1* | 12/2023 | Zahner | A61B 5/0008 |

FOREIGN PATENT DOCUMENTS

| | | |
|---|---|---|
| CN | 203455103 | 2/2014 |
| CN | 106025430 | 10/2016 |
| CN | 111028791 | 4/2020 |
| CN | 111327208 | 6/2020 |
| JP | 2014164812 | 9/2014 |
| KR | 20190105253 | 9/2019 |

\* cited by examiner

TEMPERATURE PROTECTIVE DEVICE FOR FILTER CAPACITOR BANK

CROSS-REFERENCE TO RELATED APPLICATIONS

The present application claims priority to Chinese Patent Application No. 2020109515121; Filed Sep. 11, 2020, entitled A TEMPERATURE PROTECTIVE DEVICE FOR FILTER CAPACITOR BANK that is incorporated herein by reference in its entirety.

TECHNICAL FIELD

The present invention relates to a temperature protective device, and more particularly relates to a temperature protective device for a filter capacitor bank.

BACKGROUND ART

In the prior art, a circuit may have a capacitor bank formed by parallel connection of a plurality of capacitors, which is used for, for example, filtering possible high-frequency ripple current in the circuit. The capacitor bank will generate heat while filtering the high-frequency ripple current, and some capacitors in the capacitor bank may be prone to faults. As a result, the whole capacitor bank or other parts of the circuit may be damaged. Therefore, it is necessary to detect the temperature of the capacitor bank in real time.

On the other hand, the existing temperature protective device comprises a plurality of temperature measurement devices, wherein each temperature measurement device is used for measuring the temperature of a corresponding capacitor for conducting temperature protection of the capacitor. However, the plurality of temperature measurement devices are installed on a capacitor bank or arranged near the capacitor bank, thereby increasing the difficulty in installation, complexity in the capacitor bank, manufacturing cost and later repair cost.

SUMMARY OF THE INVENTION

Aiming at the above technical problems existing in the prior art, the present invention provides a temperature protective device for a filter capacitor bank. Two or more capacitors of the capacitor bank are arranged in an array manner. The temperature protective device comprises a temperature measurement device which comprises:

a cover body covering the capacitor bank; and a single temperature sensor fixed at a center area of the cover body, which is used for measuring a temperature value of the capacitor bank; and a heat conduction pad located between the cover body and the capacitor bank, wherein the heat conduction pad and the cover body have fitted shapes.

According to the temperature protective device of the present invention, preferably, the cover body comprises a top plate, and a first side plate and a second side plate fixed on two opposite sides of the top plate, wherein the single temperature sensor is fixed at a center area of the top plate.

According to the temperature protective device of the present invention, preferably, the cover body further comprises:

a first fixation plate fixedly connected with the first side plate, which comprises a first fixation through hole; and a second fixation plate fixedly connected with the second side plate, which comprises a second fixation through hole.

According to the temperature protective device of the present invention, preferably, the heat conduction pad is made of a flexible heat conduction material; and the thickness of the heat conduction pad at a natural state is larger than an interval between the top plate and any of the capacitors in the capacitor bank. Preferably, the heat conduction pad may be constituted of one or more materials among following materials: Gap pad 1000FS, Gap pad 3000s30 and BN-FS100.

According to the temperature protective device of the present invention, preferably, the temperature protective device is applied to a switch converter, wherein the switch converter comprises two switching transistors connected to form a bridge arm, an inductor connected between a node formed by connection of the two switching transistors and the capacitor bank, as well as a switch connected between the capacitor bank and an alternating current.

The temperature protective device of the present invention, preferably, further comprises a temperature control circuit, wherein the temperature control circuit is used for, according to the temperature value, controlling a switching state of the switch and working manners of the two switching transistors; and the single temperature sensor comprises a single thermistor, wherein one end thereof is connected to a DC power supply, and the other end thereof is connected to the temperature control circuit.

According to the temperature protective device of the present invention, preferably, the temperature control circuit comprises:

a voltage follower, wherein an input end thereof is connected to the other end of the single thermistor, and an output end thereof is used for outputting an output voltage corresponding to the temperature value;

an analog-digital converter, wherein an input end thereof is connected to the output end of the voltage follower and the analog-digital converter is used for converting the output voltage of the voltage follower to a corresponding digital signal;

a digital signal processor, wherein an input end thereof is connected to an output end of the analog-digital converter and the digital signal processor is used for comparing the digital signal with a preset temperature threshold and outputting a control signal; and a driver, wherein an input end thereof is connected to an output end of the digital signal processor and the driver is used for, according to the control signal, outputting a switch driving signal to control the switching state of the switch, and outputting a pulse width modulation driving signal to control working states of the two switching transistors.

According to the temperature protective device of the present invention, preferably, the voltage follower comprises:

an operational amplifier;

a first resistor, which is connected between a non-inverting input end of the operational amplifier and a neutral point;

a second resistor, which is connected between an inverting input end of the operational amplifier and a neutral point; and a third resistor, which is connected between the inverting input end of the operational amplifier and an output end;

wherein the non-inverting input end of the operational amplifier and the output end respectively serve as an input end and an output end of the voltage follower.

According to the temperature protective device of the present invention, preferably, when the temperature value measured by the single temperature sensor is smaller than a first temperature threshold, the voltage follower outputs a corresponding first output voltage; the analog-digital converter is used for converting the first output voltage to a corresponding first digital signal; the digital signal processor is used for comparing a first temperature threshold numerical signal corresponding to the first temperature threshold with the first digital signal and outputting a first control signal; and the driver maintains a preset action of the switch unchanged.

According to the temperature protective device of the present invention, preferably, when the temperature value measured by the single temperature sensor is larger than the first temperature threshold and smaller than a second temperature threshold, the voltage follower outputs a corresponding second output voltage; the analog-digital converter is used for converting the second output voltage to a corresponding second digital signal; the digital signal processor is used for comparing the first temperature threshold numerical signal corresponding to the first temperature threshold and a second temperature threshold numerical signal corresponding to the second temperature threshold with a second digital signal respectively and outputting a second control signal; and the driver is used for, according to the second control signal, outputting a signal to control preset actions of the switch and the two switching transistors to be unchanged.

According to the temperature protective device of the present invention, preferably, when the temperature value measured by the single temperature sensor is larger than the second temperature threshold, the voltage follower outputs a corresponding third output voltage; the analog-digital converter is used for converting the third output voltage to a corresponding third digital signal; the digital signal processor is used for comparing the second temperature threshold numerical signal corresponding to the second temperature threshold with the third digital signal and outputting a third control signal; and the driver is used for, according to the third control signal, outputting a switch driving signal to control the switch to be conducted and outputting a low-level driving signal to control the two switching transistors to be cut off.

According to the temperature protective device of the present invention, preferably, after a preset period, when the temperature value measured by the single temperature sensor is larger than the second temperature threshold, the digital signal processor outputs a fourth control signal; and the driver is used for, according to the fourth control signal, outputting the switch driving signal to control the switch to be switched off and outputting the low-level driving signal to control the two switching transistors to be cut off; or when the temperature value measured by the single temperature sensor is larger than the first temperature threshold and 10° C. smaller than the second temperature threshold, the voltage follower outputs the corresponding second output voltage; the analog-digital converter is used for converting the second output voltage to the corresponding second digital signal; the digital signal processor is used for comparing the first temperature threshold numerical signal corresponding to the first temperature threshold and the second temperature threshold numerical signal corresponding to the second temperature threshold with the second digital signal respectively and outputting the second control signal; and the driver is used for, according to the second control signal, outputting the switch driving signal to control the switch to be conducted and outputting the pulse width modulation driving signal to control the two switching transistors to work in a pulse width modulation manner.

The temperature protective device of the present invention is concise in design. The single temperature sensor is used for monitoring a temperature abnormity of a bank of capacitors, and the temperature control circuit is used for executing corresponding instructions to protect the capacitor bank and the circuit. In this way, the temperature abnormity of the capacitor bank can be detected effectively in time; meanwhile, the number of the temperature sensors is reduced; and thus, the cost is effectively reduced, and the complexity in later maintenance is reduced.

BRIEF DESCRIPTION OF THE DRAWINGS

Embodiments of the present invention will be further described with reference to the accompanying drawings. In the drawings.

DETAILED DESCRIPTION OF THE INVENTION

For the purpose of making purposes, technical solutions and advantages of the present invention clearer and more understandable, the present invention will be further described based on specific embodiments in conjunction with the accompanying drawings.

Figure 1:
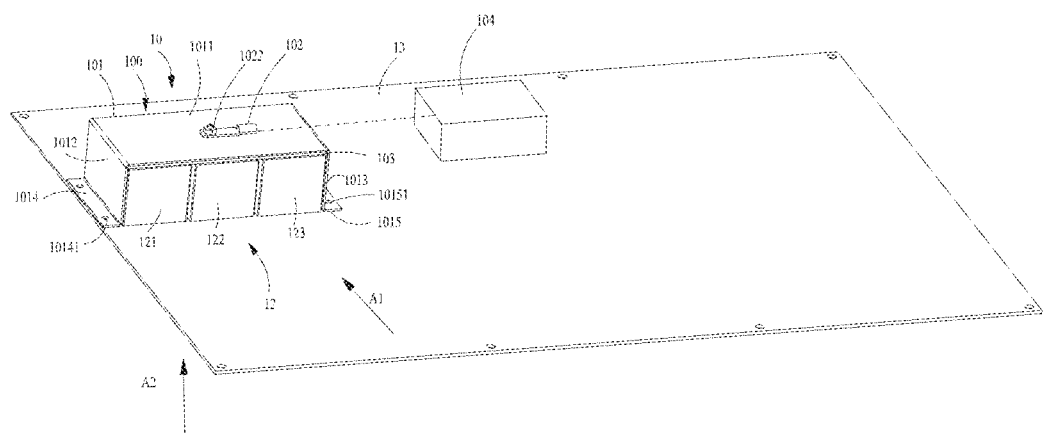
FIG. 1 is a 3D schematic diagram showing that a temperature protective device and a capacitor bank are fixed on a circuit board, according to a first embodiment of the present invention.

FIG. 1 is a 3D schematic diagram showing that a temperature protective device 10 and a capacitor bank 12 are fixed on a circuit board 13, according to a first embodiment of the present invention. As shown in FIG. 1, the circuit board 13 is preferably made of a printed circuit board. To avoid vagueness of the present invention, FIG. 1 does not show printed wires and a bonding pad on the circuit board 13. The capacitor bank 12 comprises nine capacitors electrically connected (eg. welding) to the circuit board 13 (introduction will be made in conjunction with FIG. 3-FIG. 4), wherein FIG. 1 only shows three capacitors 121, 122 and 123 thereof.

Figure 8:
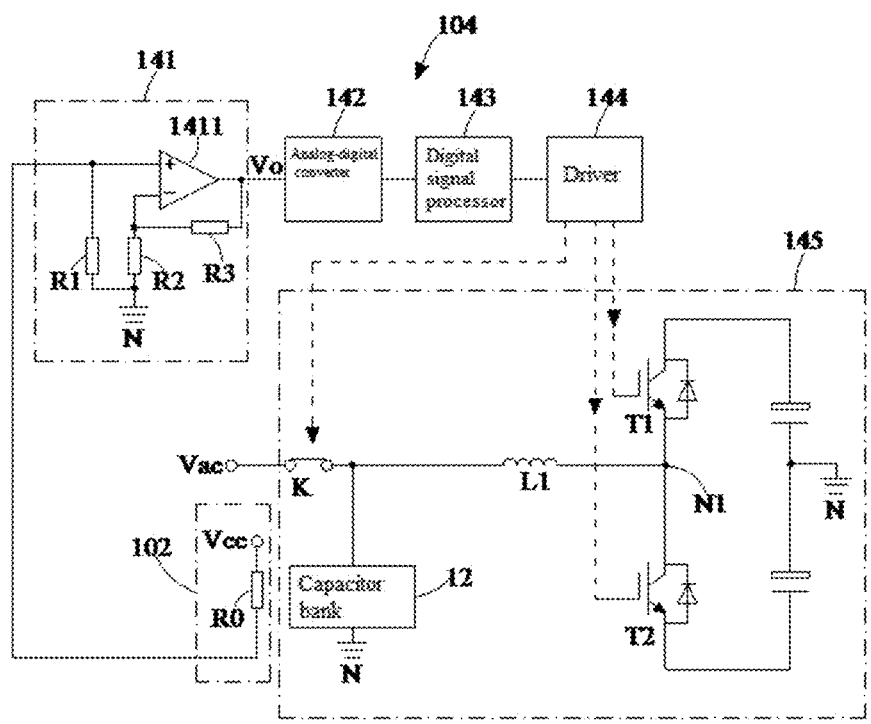
FIG. 8 is a circuit diagram showing that a temperature sensor and the temperature control circuit shown in FIG. 1 are connected with a pulse width modulation rectifier.

The temperature protective device 10 comprises a temperature measurement device 100 and a temperature control circuit 104 fixed on the circuit board 13, wherein FIG. 1 shows the temperature control circuit 104 only in the form of a cuboid, and a specific circuit structure will be introduced in conjunction with FIG. 8. The temperature measurement device 100 comprises a cover body 101 covering the capacitor bank 12, a heat conduction pad 103 located between the cover body 101 and the capacitor bank 12, and a temperature sensor 102 fixed on the cover body 101, wherein the temperature sensor 102 is electrically connected (as schematically shown by a dotted line in FIG. 1) to the temperature control circuit 104.

The cover body 101 is roughly of an inverted-U shape and is preferably made by mechanical stamping of a rectangular metal (eg. steel, aluminum or other alloys) sheet. The cover body 101 comprises: a top plate 1011; a side plate 1012 and a side plate 1013 fixed on two opposite sides of the top plate 1011; and fixation plates 1014 and 1015 fixed on the side plates 1012 and 1013 respectively, wherein the fixation plates 1014 and 1015 are parallel to the circuit board 13 and comprise a fixation through hole 10141 and a fixation through hole 10151 respectively; and the fixation through hole 10141 and the fixation through hole 10151 are configured to be applicable to being fixed on the circuit board 13 by dismountable connectors such as bolts (not shown in FIG. 1).

The heat conduction pad 103 is located between the top plate 1011 and the capacitor bank 12, wherein two sides thereof are closely fitted with the top plate 1011 and the capacitor bank 12 respectively. The temperature sensor 102 is fixed at a center area of the top plate 1011 by, for example, a bolt 1022. In this way, the temperature sensor 102 is able to accurately measure a temperature value of the center area of the top plate 1011.

Figure 2:
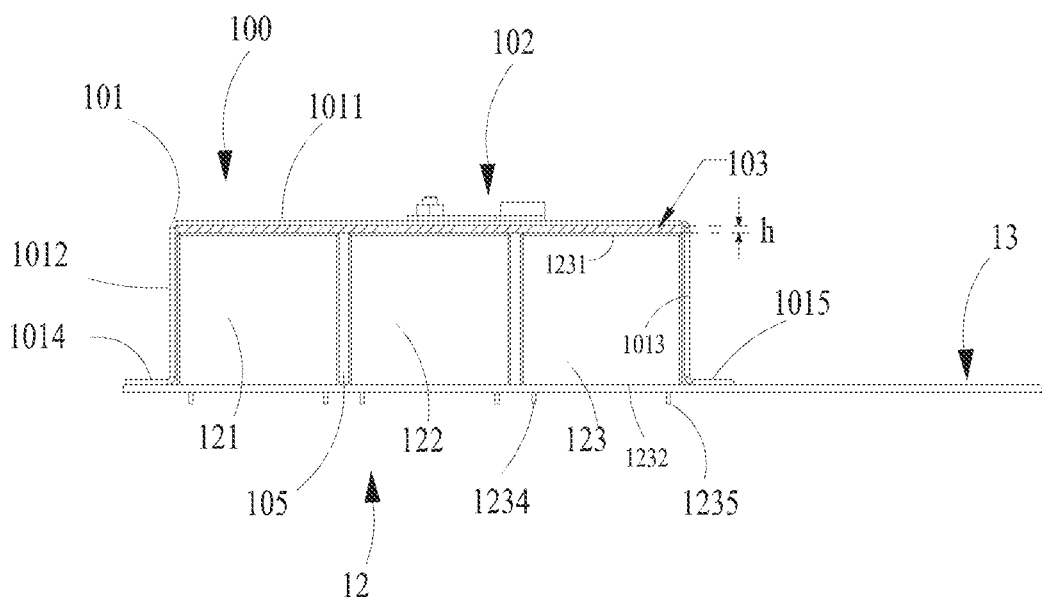
FIG. 2 is a plane diagram showing the temperature protective device, capacitor bank and circuit board shown in FIG. 1, as viewed from a direction pointed by an arrow A1.

FIG. 2 is a plane diagram showing the temperature protective device, capacitor bank and circuit board shown in FIG. 1, as viewed from a direction pointed by an arrow A1. As shown in FIG. 2, the nine capacitors in the capacitor bank 12 are same, and introduction will be made with the capacitor 123 as an example. The capacitor 123 comprises a first end face 1231 and a second end face 1232 disposed oppositely, and an electrode terminal 1234 and an electrode terminal 1235 disposed on the second end face 1232, wherein the electrode terminal 1234 and the electrode terminal 1235 pass through the circuit board 13 so as to realize electric connection with other electronic parts and components on the circuit board 13. The second end face 1232 of the capacitor 123 is parallel with the circuit board 13, so that the capacitor 123 can be stably fixed on the circuit board 13 without use of a clamping device or a fixation device.

The side plate 1012 and the side plate 1013 of the cover body 101 are disposed oppositely, so that the side plate 1012, the side plate 1013, the top plate 1011 and a part of the circuit board 13 define cuboid storage space 105 which is used for storing the capacitor bank 12. An interval between the top plate 1011 and the first end face 1231 of the capacitor 123 is h.

The heat conduction pad 103 is located between the top plate 1011 and the capacitor bank 12; the heat conduction pad 103 is made of a flexible heat conduction material; and the thickness thereof in a natural state (without bearing of an extrusion pressure) is lightly larger than the interval h between the top plate 1011 and the capacitor bank 12.

When the fixation plates 1014 and 1015 are closely fitted and fixed on the circuit board 13, the top plate 1011 and the capacitor bank 12 extrude the heat conduction pad 103 to make the pad have elastic deformation to a certain extent, so that the two opposite side faces of the heat conduction pad 103 are closely fitted with the top plate 1011 and the capacitor bank 12 respectively; clearance between the top plate 1011 and the capacitor bank 12 is avoided; heat generated by the capacitor bank 12 is transmitted by the heat conduction pad 103 to the top plate 1011; heat dissipation performance of the capacitor bank 12 is improved; meanwhile, the temperature sensor 102 fixed on the top plate 1011 is able to accurately measure the temperature of the capacitor bank 12; and meanwhile, even in case of a certain deviation in the capacitor height, all the capacitors can be in close contact with the top plate.

Figure 3:
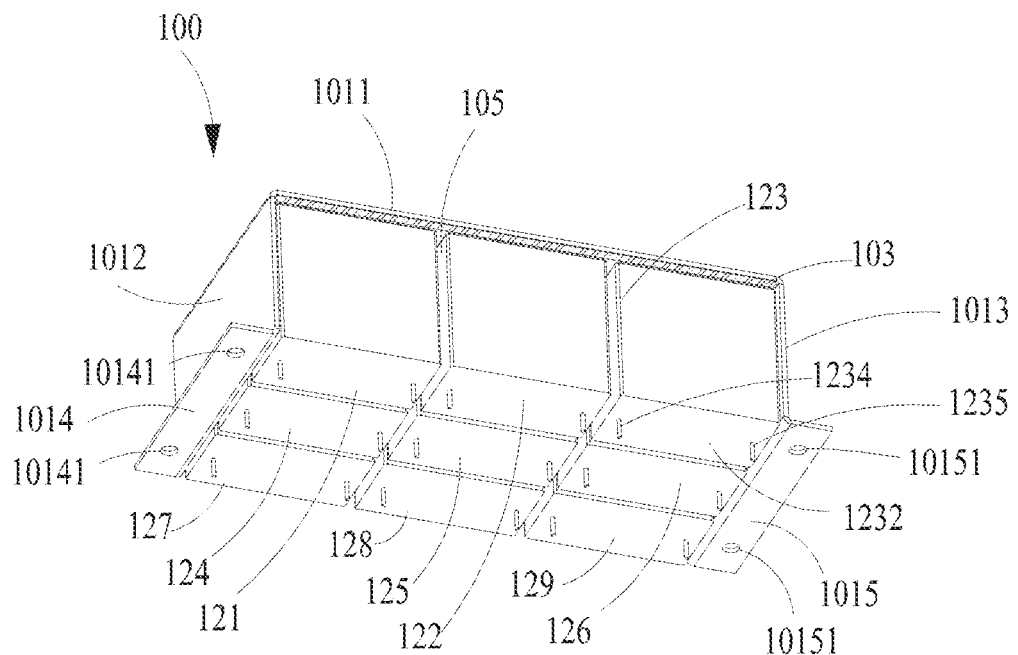
FIG. 3 is a 3D schematic diagram as viewed from a direction pointed by an arrow A2, after removal of the circuit board and a temperature control circuit shown in FIG. 1.

FIG. 3 is a 3D schematic diagram as viewed from a direction pointed by an arrow A2, after removal of the circuit board and the temperature control circuit 104 shown in FIG. 1. As shown in FIG. 3, there is space storing the nine cuboid-shaped capacitors 121, 122, 123, 124, 125, 126, 127, 128 and 129 (with the capacitors inside being removed). The nine capacitors 121-129 are arranged in an array with three rows and three columns at certain intervals, so that the capacitor bank 12 occupies the cuboid-shaped space and is applicable to being located in the storage space 105.

Figure 4:
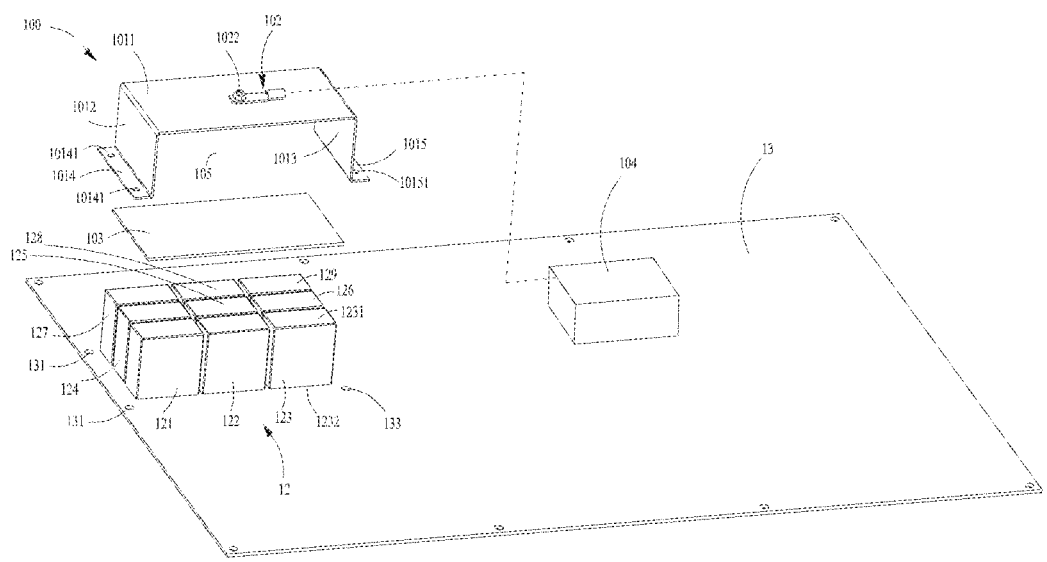
FIG. 4 is an exploded view of the temperature protective device shown in FIG. 1.

FIG. 4 is an exploded view of the temperature protective device shown in FIG. 1. As shown in FIG. 4, the heat conduction pad 103 is shaped like a rectangular sheet or a plate, and the shape thereof is roughly the same as that of the top plate 1011. The heat conduction pad 103 is applicable to being clamped between the top plate 1011 and the first end face of each of the nine capacitors 121-129.

The circuit board 13 further comprises a through hole 131 aligned with the fixation through hole 10141 of the fixation plate 1014, and a through hole 133 aligned with the fixation through hole 10151 of the fixation plate 1015.

An assembly process of the temperature measurement device 100 will be introduced in conjunction with FIG. 4. At first, the 9 capacitors 121-129 are placed on the circuit board 13 in the array with the three rows and three columns; and then the heat conduction pad 103 is placed on the first end face of any of the 9 capacitors 121-129. Then, the cover body 101 is made to cover the heat conduction pad 103 and the capacitor bank 12, so that the capacitor bank 12 and the heat conduction pad 103 are located in the storage space 105; meanwhile, the fixation through hole 10141 of the fixation plate 1014 and the fixation through hole 10151 of the fixation plate 1015 are aligned with the through hole 131 and the through hole 133 in the circuit board 13 respectively; and dismountable connectors such as bolts (not shown in FIG. 4) are used for firmly fixing the cover body 101 on the circuit board 13. During fastening of the bolts, the top plate 1011 and the capacitor bank 12 extrude the heat conduction pad 103 so as to make the pad have elastic deformation. The temperature sensor 102 is fixed by screws at the center area of the top plate 1011. The temperature control circuit 104 will be welded on the circuit board 13 through tin soldering of a tin soldering furnace.

Next, a diagram showing temperature distribution of the capacitor bank 12 under different working situations, which is obtained through analog computation based on ANSYS simulation software.

Figure 5:
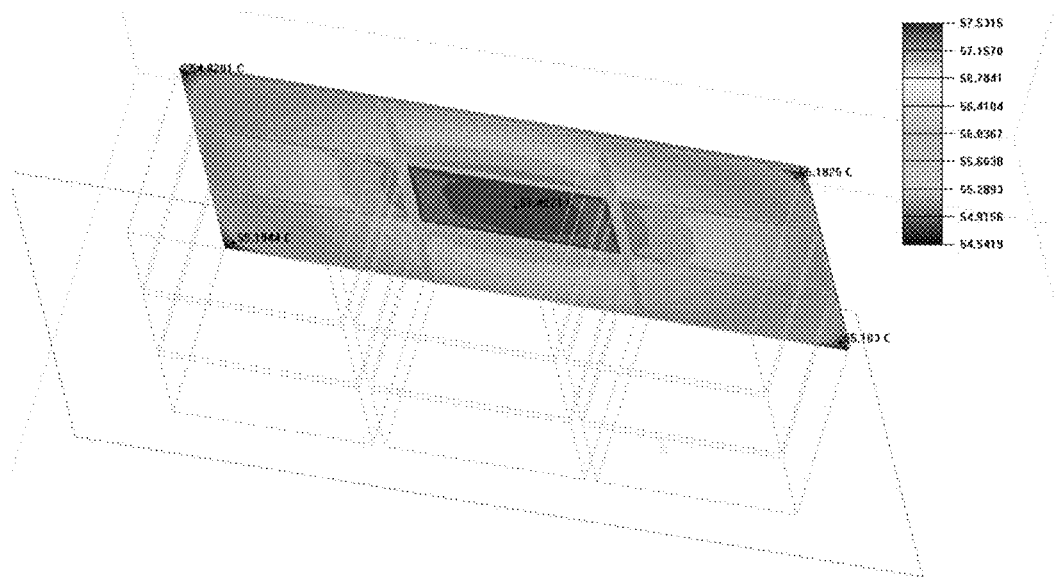
FIG. 5 is a diagram showing temperature distribution when each capacitor in the capacitor bank shown in FIG. 1 is in a normal working state.

FIG. 5 is a diagram showing temperature distribution when each capacitor in the capacitor bank 12 shown in FIG. 1 is in a normal working state. The ambient temperature is 40° C. and a thermal loss of each of the capacitors 121-129 is 0.5 W. As shown in FIG. 5, the temperature at the center position of the top plate 1011 is about 57.4221° C., and temperatures at four peaks of the top plate 1011 are 54.8291° C., 55.1944° C., 55.103° C. and 55.1825° C. respectively.

Figure 6:
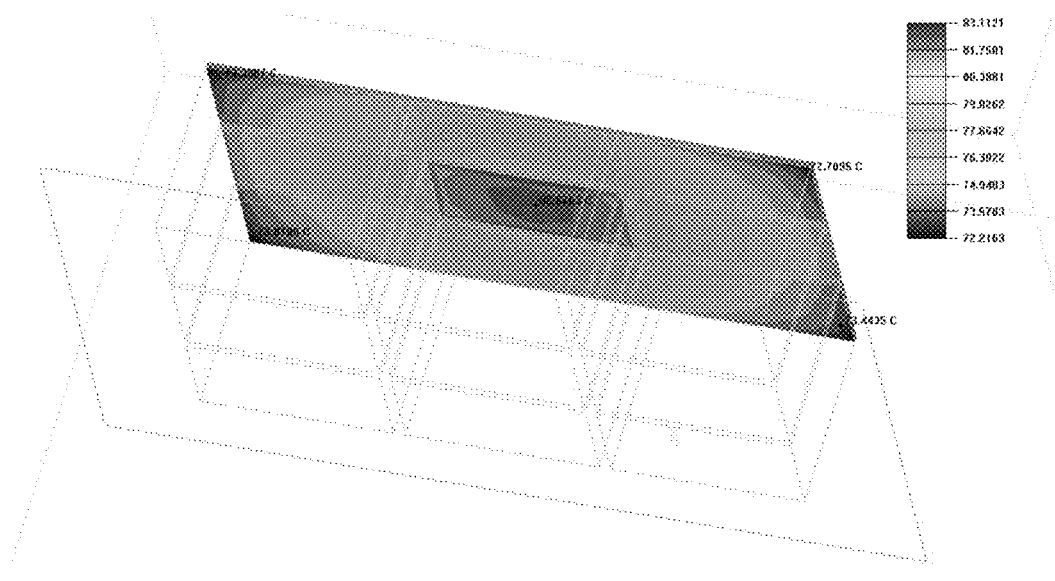
FIG. 6 is a diagram showing temperature distribution when the capacitor, at a center area, in the capacitor bank shown in FIG. 1 is in an abnormal working state.

FIG. 6 is a diagram showing temperature distribution when the capacitor, at the center area, in the capacitor bank 12 shown in FIG. 1 is in an abnormal working state. The ambient temperature is 40° C., the capacitor 125 is in an abnormal working state with a thermal loss of 3.5 w, and a thermal loss of each of the other capacitors is 0.5 w. As shown in FIG. 6, the temperature at the center position of the top plate 1011 is about 82.6763° C., and temperatures at four peaks of the top plate 1011 are 73.3887° C., 73.0708° C., 73.4435° C. and 72.7895° C. respectively.

Figure 7:
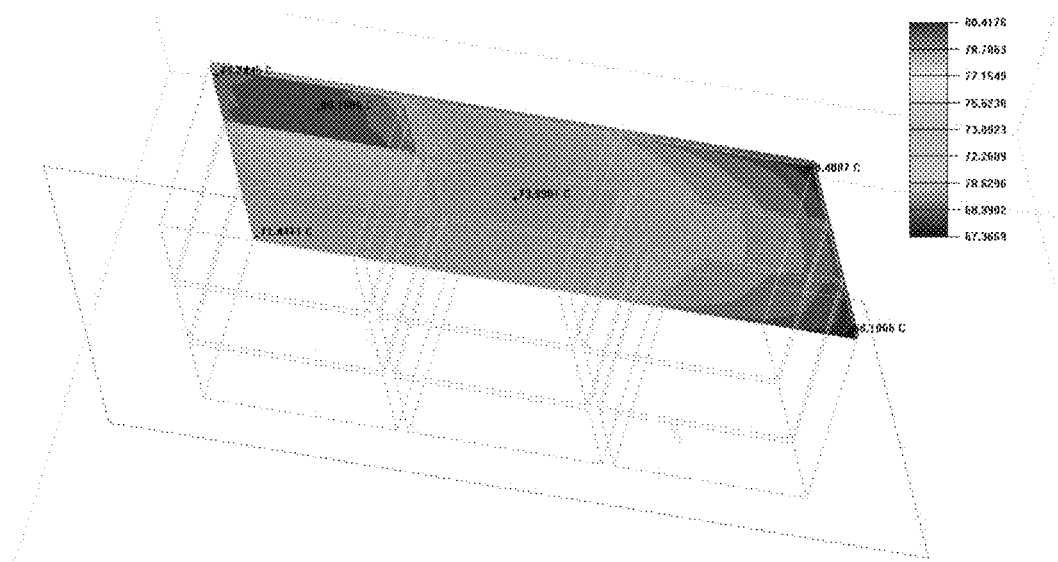
FIG. 7 is a diagram showing temperature distribution when the capacitor, at an edge, in the capacitor bank shown in FIG. 1 is in an abnormal working state.

FIG. 7 is a diagram showing temperature distribution when the capacitor, at an edge, in the capacitor bank 12 shown in FIG. 1 is in an abnormal working state. The ambient temperature is 40° C., the capacitor 127 is in an abnormal working state with a thermal loss of 3.5 w, and a thermal loss of each of the other capacitors is 0.5 w. As shown in FIG. 7, the temperature at the center position of the top plate 1011 is about 73.9901° C., and temperatures at four peaks of the top plate 1011 are 79.2445° C., 71.4411° C., 68.1066° C. and 68.4087° C. respectively. The temperature at the center, close to the first end face of the capacitor 127, of the top plate 1011 is 80.1606° C.

It is shown in three above temperature simulation results that, when each capacitor in the capacitor bank 12 is in the normal working state, the center area of the top plate 1011 has a normal temperature value; and when any capacitor in the capacitor bank 12 fails or is damaged, the temperature at the center area of the top plate 1011 is larger than the above normal temperature value.

In the present embodiment, the nine capacitors in the capacitor bank 12 are arranged on the circuit board 13 in the form of an array. Based on the ambient temperature and various working parameters of the capacitor bank 12, a threshold temperature scope of the center area of the top plate is obtained through simulation analysis of the simulation software. For example, the threshold temperature scope is set to be 55° C. to 73° C. The single temperature sensor 102 is used for measuring the temperature at the center area of the top plate 1011. According to measurement results, it can be judged whether the nine capacitors in the capacitor bank 12 are in the normal working state.

Next, protection principles of the temperature control circuit towards the capacitor bank 12 will be introduced further in conjunction with a specific circuit diagram of the temperature control circuit 104 and working principles thereof.

FIG. 8 is a circuit diagram showing that the temperature sensor and the temperature control circuit 104 shown in FIG. 1 are connected with a pulse width modulation rectifier. As shown in FIG. 8, the pulse width modulation rectifier 145 comprises: an insulated gate bipolar transistor T1 and an insulated gate bipolar transistor T2, an inductor L1, the capacitor bank 12 and a switch K, wherein one end of the inductor L1 is connected to a node N1 formed by connection of the insulated gate bipolar transistors T1 and T2; the capacitor bank 12 is connected between the other end of the inductor L1 and a neutral point N; and the switch K is connected between the other end of the inductor L1 and an alternating current Vac (eg. mains supply).

The temperature sensor 102 comprises a DC power supply Vcc and a thermistor R0 which are electrically connected, wherein the thermistor R0 is a thermistor with a negative temperature coefficient.

The temperature control circuit 104 comprises: a voltage follower 141, wherein an input end thereof is connected to the temperature sensor 102; an analog-digital converter 142, wherein an input end thereof is connected to an output end of the voltage follower 141; a digital signal processor 143, wherein an input end thereof is connected to an output end of the analog-digital converter 142; and a driver 144, wherein an input end is connected to an output end of the digital signal processor 143, and an output end thereof is used for outputting a driving signal to control a switching state of the switch K and working states of the insulated gate bipolar transistors T1 and T2.

The voltage follower 141 comprises an operational amplifier 1411, a resistor R1, a resistor R2 and a resistor R3. The resistor R1 is connected between a non-inverting input end of the operational amplifier 1411 and the neutral point N; the resistor R2 is connected between an inverting input end of the operational amplifier 1411 and the neutral point N; and the resistor R3 is connected between the inverting input end of the operational amplifier 1411 and an output end. The non-inverting input end of the operational amplifier 1411 serves as the input end of the voltage follower 141 and is connected to the DC power supply Vcc by the thermistor R0; and the output end of the operational amplifier 1411 serves as the output end of the voltage follower 141.

Based on principles of "virtual open circuit" (namely the non-inverting input end and the inverting input end are deemed as an equivalent open circuit) and "virtual short circuit" (namely the non-inverting input end and the inverting input end are deemed to be equipotential), an output voltage Vo of the voltage follower 141 is calculated with the following equation.

$$Vo = \frac{R1' \times (R2' + R3') \times Vi}{R2' \times (R0' + R1')}$$

Where: R0' is a resistance value of the resistor R0; R1' is a resistance value of the resistor R1; R2' is a resistance value of the resistor R2; R3' is a resistance value of the resistor R3; and Vi is a voltage of the DC power supply Vcc.

When the temperature of the capacitor bank 12 increases, the resistance value R0' of the thermistor R0 decreases, and the voltage output by the temperature sensor 102 increases, so that the output voltage Vo of the voltage follower 141 increases. On the contrary, when the temperature of the capacitor bank 12 decreases, the resistance value R0' of the thermistor R0 increases, and the voltage output by the temperature sensor 102 decreases, so that the output voltage Vo of the voltage follower 141 decreases. In this way, the output voltage Vo of the voltage follower 141 follows the temperature of the capacitor bank 12.

An existing analog-digital converter can be selected as the analog-digital converter 142 which is used for converting the output voltage Vo of the voltage follower 141 to a corresponding digital signal.

The digital signal processor 143 is used for comparing the digital signal output by the analog-digital converter 142 with a preset temperature threshold and outputting a control signal according to a comparison result.

The driver 144 is used for, according to the received control signal, outputting a switch driving signal to control the switching state of the switch K (eg. conducted or switched off), and outputting a pulse width modulation driving signal to control the working states of the insulated gate bipolar transistors T1 and T2. For example, the insulated gate bipolar transistors T1 and T2 are controlled to work in a pulse width modulation manner (namely, the transistors are alternately conducted and cut off at a switching frequency of the pulse width modulation driving signal), or the insulated gate bipolar transistors T1 and T2 are controlled to keep a cut-off state so as to make the pulse width modulation rectifier 145 stop working.

Next, working principles of the temperature control circuit 104 will be described aiming at different temperature situations of the capacitor bank 12, which are measured by the temperature sensor 102, respectively.

(1) When the circuit in which the capacitor bank 12 is located is in an off state, the capacitor bank has not yet started working, and the temperature is lower than a normal working temperature thereof (namely a first temperature threshold). At this time, the temperature value of the capacitor bank 12, which is measured by the temperature sensor 102, is smaller than the first temperature threshold (eg. lower than 55° C.), and the voltage follower 141 outputs a corresponding first output voltage Vo1. The analog-digital converter 142 converts the first output voltage Vo1 to a corresponding first digital signal. The digital signal processor 143 compares a first temperature threshold numerical signal corresponding to the first temperature threshold with the first digital signal received by an input end thereof. The first digital signal < the first temperature threshold numerical signal, so that the digital signal processor 143 outputs a first control signal. The driver 144 receives the first control signal and does not execute any action.

(2) When the circuit in which the capacitor bank 12 is located is in a conducted state, the capacitor bank starts working. At this time, the temperature of the capacitor bank 12 increases relative to the non-working state, and the temperature value is larger than the first temperature threshold and smaller than a second temperature threshold. For example, in a normal working state of a pulse width modulation circuit, an initial state of the switch K is in a conducted state at this time, and an initial state of the driver is that the pulse width modulation driving signal is output to control the insulated gate bipolar transistors T1 and T2 to work in the pulse width modulation manner, so that the mains supply is converted to a direct current. At this time, when the temperature value of the capacitor bank 12, which is measured by the temperature sensor 102, is larger than the first temperature threshold and smaller than the second temperature threshold (eg. 73° C.), the voltage follower 141 outputs a corresponding second output voltage Vo2. The analog-digital converter 142 converts the second output voltage Vo2 to a corresponding second digital signal. The digital signal processor 143 compares the first temperature threshold numerical signal and a second temperature threshold numerical signal corresponding to the second temperature threshold with a second digital signal received by the input end thereof, respectively. The first temperature threshold numerical signal ≤ the second digital signal < the second temperature threshold numerical signal, so that the digital signal processor 143 outputs a second control signal. The driver 144 receives the second control signal and maintains a control action of a switching converter, which is executed by the pulse width modulation circuit, unchanged.

(3) When the capacitor bank 12 is in a power-on working state, once one of the capacitors is damaged and suffers abnormal temperature increase, the temperature near the temperature sensor will rapidly increase to be higher than the second temperature threshold. When the temperature value of the capacitor bank 12, which is measured by the temperature sensor 102, is larger than the second temperature threshold, the voltage follower 141 outputs a corresponding third output voltage Vo3. The analog-digital converter 142 converts the third output voltage Vo3 to a corresponding third digital signal. The digital signal processor 143 compares the second temperature threshold numerical signal with the third digital signal received by the input end thereof. The second temperature threshold numerical signal ≤ the third digital signal, so that the digital signal processor 143 outputs a third control signal. The driver 144 receives the third control signal, outputs a high-level switch driving signal to control the switch K to be conducted and outputs a low-level driving signal to control the insulated gate bipolar transistors T1 and T2 to be cut off and stop working in the pulse width modulation manner, so that the high-frequency ripple current loaded on the capacitors 121-129 is removed.

(31) After a preset period, if the temperature value of the capacitor bank 12, which is measured by the temperature sensor 102, is still larger than the second temperature threshold, the digital signal processor 143 outputs a fourth control signal. The driver 144 receives the fourth control signal, outputs the low-level switch driving signal to control the switch K to be switched off, and outputs the low-level driving signal to control the insulated gate bipolar transistors T1 and T2 to be cut off. The ripple current generated by the inductor of the rectifier and possible high-frequency ripple components from an AC side are removed, and working in the pulse width modulation manner is stopped. (32) After the preset period, if the temperature value of the capacitor bank 12, which is measured by the temperature sensor 102, is larger than the first temperature threshold and 10° C. (or a value between 5° C. and 20° C.) lower than the second temperature threshold (here, in general, an interval value between the first threshold temperature and the second threshold temperature is larger than 10° C.), the digital signal processor 143 outputs the second control signal. The driver 144 receives the second control signal, outputs the high-level switch driving signal to control the switch K to be conducted, and outputs the pulse width modulation driving signal to control to insulated gate bipolar transistors T1 and T2 to work in the pulse width modulation manner, so that the mains supply is converted to the DC current.

According to the present invention, the capacitor bank is arranged in the form of an array; the single temperature sensor 102 measures the temperature at the center area of the capacitor bank; and the temperature control circuit 104, according to the temperature value measured by the single temperature sensor 102, controls the switching state of the switch K and the working manners of the insulated gate bipolar transistors T1 and T2, so that the capacitor bank 12 can be effectively protected.

The cover body 100 is made of a material with good heat dissipation performance, such as a metal material and covers the capacitor bank 12, so that efficient heat dissipation of the capacitor bank is ensured. Heat generated by the capacitor bank 12 can be transmitted to the cover body 100, and then the single temperature sensor fixed on the cover body 100 can measure the temperature of the capacitor bank 12 accurately in time.

The cover body 100 defines the storage space used for storing the capacitor bank 12, and the heat generated by the capacitor bank 12 increases and then is transmitted to the cover body 100.

The fixation plates 1014 and 1015 on the cover body 100 are configured to be fixed on the circuit board 13. On one side, this mode is used for fixing the capacitor bank 12; and on the other side, thermal transmission between the cover body 100 and the capacitor bank 12 is kept unchanged and thus the single temperature sensor is able to accurately measure temperature changes of the capacitor bank 12.

The heat conduction pad 103 arranged between the cover body 100 and the capacitor bank 12 improves heat conduction performance and enables the heat generated by the capacitor bank 12 to be more uniformly transmitted to the top plate 1011, so that detection accuracy of the temperature sensor is increased.

The heat conduction pad 103 is made of the flexible material and is in close contact with the top plate 1011 and the capacitor bank 12, so that a measurement error caused by heat transmission by air between the capacitor bank 12 and the top plate 1011 is avoided, and ununiform contact between the capacitors and the cover body caused by the height deviation of the capacitors is avoided.

The thickness of the heat conduction pad 103 is preferably larger than the distance between any capacitor in the capacitor bank 12 and the top plate 1011, so that even if each capacitor generates an allowance and then causes differences in the distance to the top plate 1011, the distance can still be completely filled by the heat conduction pad 103, while no clearance will be left between the capacitor bank 12 and the top plate 1011 and consequent low-efficiency heat dissipation and ununiform heat dissipation can be avoided.

The output voltage of the voltage follower 141 and the temperature of the capacitor bank 12 have a same changing trend, so that the temperature changes of the capacitor bank 12 can be visually shown.

The driver 144 controls the insulated gate bipolar transistors T1 and T2 to be cut off, so that the pulse width modulation rectifier 145 does not generate the high-frequency ripple current; a workload of the capacitor bank 12 is reduced; and the capacitor bank 12 is cooled and temperature protection thereof is realized. In addition, the switch K is controlled to be switched off, so that the capacitor bank 12 is further protected from potential damage risks, and damage to the whole circuit, caused by dangers such as capacitor fire outbreaking, can be effectively prevented.

When the temperature of the capacitor bank 12 exceeds the second temperature threshold, after the preset period, the switch K and the working states of the insulated gate bipolar transistors are again controlled according to the temperature situations of the capacitor bank 12, so that an instant high temperature in the capacitor bank 12, which can cause the pulse width modulation rectifier 145 to stop working, can be effectively avoided.

The temperature protective device 104 of the present invention is not limited to temperature protection over the capacitor bank 12 in a half-bridge pulse width modulation circuit 145, and may realize temperature protection over a capacitor bank in a full-bridge pulse width modulation circuit or other pulse width modulation circuits.

The temperature protective device of the present invention is not limited to temperature protection over the capacitor bank in the pulse width modulation circuit and may realize temperature protection over a capacitor bank in a switch control circuit, especially that in a high-frequency switch control circuit and especially a filter capacitor bank. The temperature protective device may be applied to circuits of a rectifier, an inverter or the like.

In another embodiment of the present invention, the fixation plates 1014 and 1015 may be connected with the circuit board 13 by a commonly used fixation manner in industrial production, such as fixation by screws, buckle fixation or gluing. The paper does not limit the connection manner.

The temperature protective device 10 of the present invention is not limited to temperature protection over the capacitor bank which is arranged in the array with three rows and three columns. When the capacitor bank is arranged into an array such as a square array, a round array or an oval array or the like, the temperature protective device 10 can still realize temperature protection over the capacitor bank.

Figure 9:
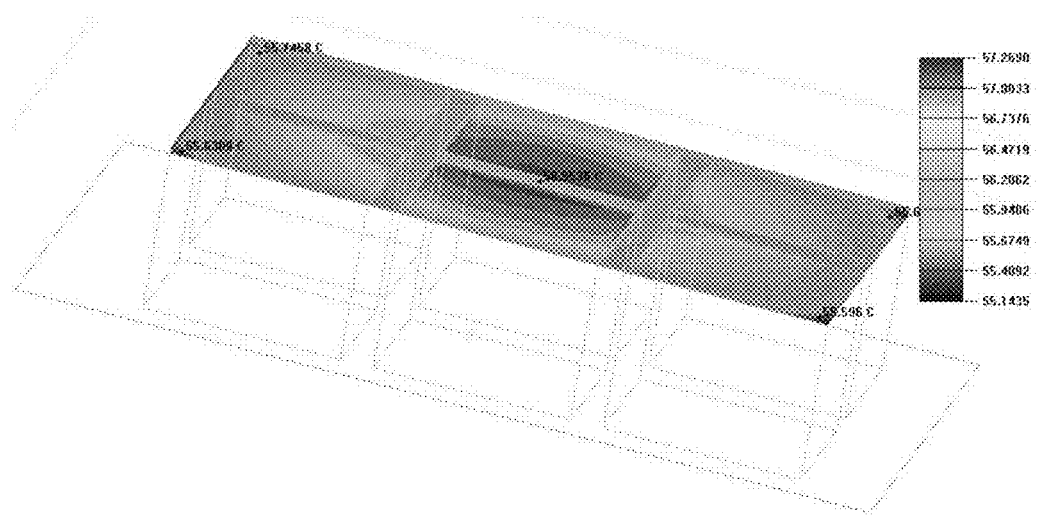
FIG. 9 is a diagram showing temperature distribution when each capacitor in a capacitor bank according to a second embodiment is in a normal working state.
Figure 10:
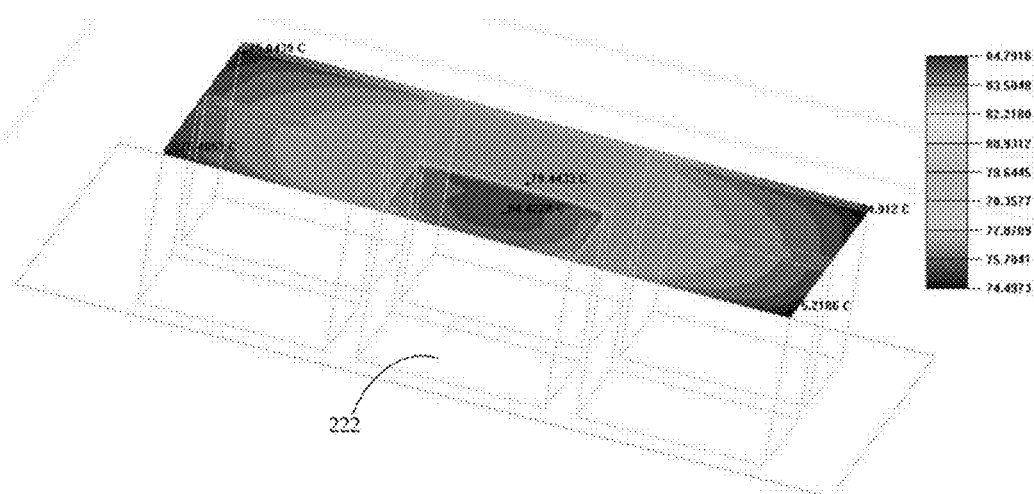
FIG. 10 is a diagram showing temperature distribution when the capacitor, close to a center position, in the capacitor bank according to the second embodiment is in an abnormal working state.
Figure 11:
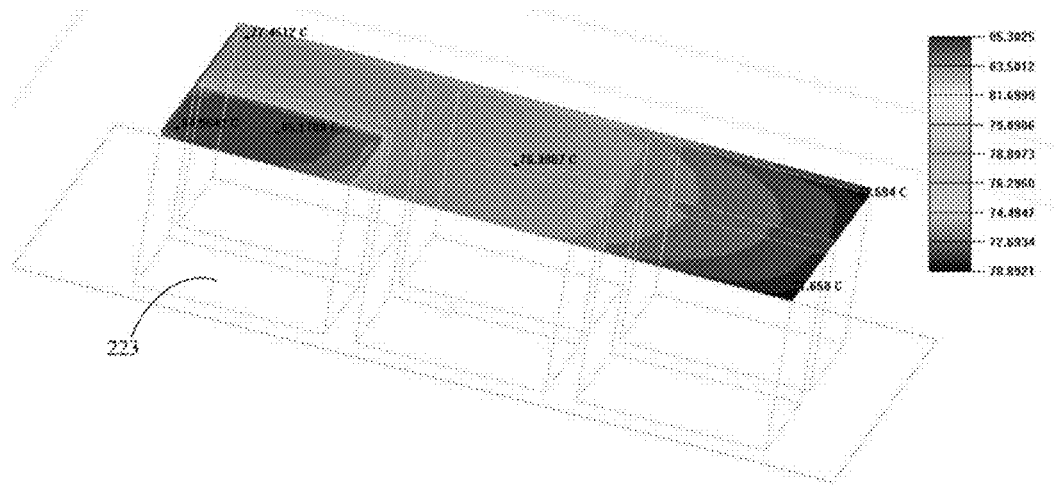
FIG. 11 is a diagram showing temperature distribution when the capacitor, close to an edge position, in the capacitor bank according to the second embodiment is in an abnormal working state.

Next, with a second capacitor bank arranged in another array (as shown in FIG. 9-FIG. 11) as the example, the situation that the single temperature sensor can also measure the temperature of the capacitor with another similar structure is described. The second capacitor bank comprises six capacitors which are arranged into the form of an array with two rows and three columns (or called three rows and two columns).

FIG. 9 is a diagram showing temperature distribution when each capacitor in the second capacitor bank is in a normal working state. The ambient temperature is 40° C. and a thermal loss of each capacitor is about 0.65 W. As shown in FIG. 9, the temperature at the center area of the top plate is about 56.5536° C., and temperatures at four corners of the top plate are 55.7458° C., 55.6309° C., 55.596° C. and 55.6° C. respectively.

FIG. 10 is a diagram showing temperature distribution when a capacitor 222 in the second capacitor bank is in an abnormal working state. The ambient temperature is 40° C., the capacitor 222 is in an abnormal working state with a thermal loss of 3.8 w, and a thermal loss of each of the other five capacitors is 0.65 w. As shown in FIG. 10, the temperature at the center area of the top plate is about 79.4433° C., the temperature at the peak center of the capacitor 222 is 84.4228° C. and temperatures at four corners of the top plate are 75.0439° C., 75.4053° C., 75.2186° C. and 74.912° C. respectively.

FIG. 11 is a diagram showing temperature distribution when a capacitor 233, at another corner, in the second capacitor bank is in an abnormal working state. The ambient temperature is 40° C., the capacitor 223 is in an abnormal working state with a thermal loss of 3.8 w, and a thermal loss of each of the other five capacitors is 0.65 w. As shown in FIG. 11, the temperature at the center area of the top plate is about 76.3807° C., the temperature at the peak center of the damaged capacitor 223 is 85.1708° C., the temperature at the corner where the capacitor is located is 84.9642° C. and temperatures at other three corners are 77.4512° C., 71.658° C. and 71.694° C. respectively.

According to above three temperature simulation results, when each capacitor in the second capacitor bank is in the normal working state, the center area of the top plate has a normal temperature value; and when any capacitor in the second capacitor bank fails or is damaged, the temperature at the center area of the top plate is larger than the above normal temperature value. Therefore, the second capacitor bank is arranged into the other array form; a threshold temperature scope of the center area of the top plate is obtained through simulation analysis of simulation software; the single temperature sensor is fixed at the center area of the cover body to measure the temperature; and according to a measurement result, whether the capacitors in the second capacitor bank are in a normal working state can be judged.

The present invention has been described by the preferable embodiments, but the present invention is not limited to the embodiments described herein and may include various changes and alterations made without departing from the scope of the present invention.

The invention claimed is:

1. A temperature protective device for a filter capacitor bank comprising two or more capacitors arranged in an array, the temperature protective device comprising:
   a cover body configured to cover the two or more capacitors of the capacitor bank; and
   a temperature sensor attached to the cover body; and
   a heat conduction pad located between the cover body and the capacitor bank and configured to be compressed between the cover body and the capacitor bank.

2. The temperature protective device according to claim 1, wherein the cover body comprises a top plate, and a first side plate and a second side plate fixed on two opposite sides of the top plate, wherein the temperature sensor is attached to the top plate at a center of the top plate.

3. The temperature protective device according to claim 2, wherein the cover body further comprises:
   a first fixation plate fixedly attached to the first side plate and having a first fixation through hole therein; and
   a second fixation plate fixedly attached to the second side plate and having a second fixation through hole therein.

4. The temperature protective device according to claim 2, wherein the heat conduction pad is made of a flexible heat conduction material and wherein an uncompressed thickness of the heat conduction pad is greater than distance between the top plate and any of the capacitors in the capacitor bank.

5. The temperature protective device according to claim 1, wherein the temperature protective device is applied to a switch converter comprising two switching transistors connected to form a bridge arm, an inductor connected between a node formed by connection of the two switching transistors and the capacitor bank, and a switch connected between the capacitor bank and an alternating current source or load.

6. The temperature protective device according to claim 5, further comprising a temperature control circuit configured to control the switch and the two switching transistors; and
   wherein the temperature sensor comprises a single thermistor having a first terminal connected to a DC power supply a second terminal connected to the temperature control circuit.

7. The temperature protective device according to claim 6, wherein the temperature control circuit comprises:
   a voltage follower having an input connected to the second terminal of the single thermistor and an output configured to produce an output voltage corresponding to a temperature sensed by the temperature sensor, wherein
   the voltage follower comprises:
   an operational amplifier;
   a first resistor connected between a non-inverting input of the operational amplifier and a neutral point;
   a second resistor connected between an inverting input of the operational amplifier and a neutral point; and
   a third resistor connected between the inverting input of the operational amplifier and an output of the operational amplifier;
   wherein the non-inverting input of the operational amplifier and the output of the operational amplifier respectively serve as an input and an output of the voltage follower;
   an analog-digital converter having an input connected to the output of the voltage follower and configured to convert the output voltage of the voltage follower to a corresponding digital signal produced at an output of the analog-digital converter;
   a digital signal processor having an input connected to the output of the analog-digital converter and configured to compare the digital signal with a preset temperature threshold and responsively produce a control signal; and
   a driver having an input connected to output of the digital signal processor and configured to produce a switch driving signal to control the switch, and a pulse width modulation driving signal to control the two switching transistors responsive to the control signal.

8. The temperature protective device according to claim 7, wherein when the temperature measured by the temperature sensor is less than a first temperature threshold, the voltage follower outputs a corresponding first output voltage; the analog-digital converter converts the first output voltage to a corresponding first digital signal; the digital signal processor compares a first temperature threshold numerical signal corresponding to the first temperature threshold with the first digital signal and produces a first control signal; and the driver, according to the first control signal, maintains a preset action of the switch unchanged.

9. The temperature protective device according to claim 8, wherein when the temperature value measured by the temperature sensor is greater than the first temperature threshold and less than a second temperature threshold, the voltage follower outputs a corresponding second output voltage;
   the analog-digital converter converts the second output voltage to a corresponding second digital signal; the digital signal processor compares the first temperature threshold numerical signal corresponding to the first temperature threshold and a second temperature threshold numerical signal corresponding to the second temperature threshold with a second digital signal, respectively, and produces a second control signal; and the driver, according to the second control signal, maintains preset actions of the switch and the two switching transistors unchanged.

10. The temperature protective device according to claim 9, wherein when the temperature measured by the temperature sensor is greater than the second temperature threshold, the voltage follower outputs a corresponding third output voltage; the analog-digital converter converts the third output voltage to a corresponding third digital signal; the digital signal processor compares the second temperature threshold numerical signal corresponding to the second temperature threshold with the third digital signal and produces a third control signal; and the driver, according to the third control signal, causes the switch to conduct and turns the two switching transistors.

11. The temperature protective device according to claim 10, wherein after a preset period,
   when the temperature value measured by the temperature sensor is greater than the second temperature threshold, the digital signal processor outputs a fourth control signal; and the driver, according to the fourth control signal, turns the switch off and turns the two switching transistors off; or when the temperature value measured by the temperature sensor is greater than the first temperature threshold and 10° C. less than the second temperature threshold, the voltage follower outputs the corresponding second output voltage; the analog-digital converter converts the second output voltage to the corresponding second digital signal; the digital signal processor compares the first temperature threshold numerical signal corresponding to the first temperature threshold and the second temperature threshold numerical signal corresponding to the second temperature threshold with the second digital signal, respectively, and produces the second control signal; and the driver, according to the second control signal, causes the switch to conduct and the two switching transistors to work in a pulse width modulation manner.

12. An apparatus comprising:

a plurality of capacitors arranged in an array on a substrate;

a compressible heat conduction pad disposed on the plurality of capacitors;

a metal plate on the heat conduction pad, wherein the heat conduction pad is compressed between the metal plate and the plurality of capacitors; and a temperature sensor on the metal plate.

13. The apparatus of claim 12, wherein the plate comprises a first plate and further comprising second and third plates joined to the first plate at first and second opposite edges thereof and extending perpendicularly from the first plate toward the substrate.

14. The apparatus of claim 13, wherein the first, second and third plates bound a cuboid space containing the plurality of capacitors.

15. The apparatus of claim 13, further fourth and fifth plates joined to respective ones of the second and third plates and affixed to the substrate.

16. The apparatus of claim 13, wherein the temperature sensor comprises a single temperature sensor positioned at a center of the first plate.

* * * * *